(12) United States Patent
Cosby et al.

(10) Patent No.: US 8,723,614 B2
(45) Date of Patent: May 13, 2014

(54) TRIGGER ACTIVATED ADJUSTABLE PULSE WIDTH GENERATOR CIRCUIT FOR AUTOMOTIVE EXHAUST AFTER-TREATMENT AND INJECTION

(75) Inventors: Douglas Edward Cosby, Yorktown, VA (US); Perry Robert Czimmek, Williamsburg, VA (US)

(73) Assignee: Continental Automotive Systems, Inc., Auburn Hills, MI (US)

( * ) Notice: Subject to any disclaimer, the term of this patent is extended or adjusted under 35 U.S.C. 154(b) by 322 days.

(21) Appl. No.: 13/240,736

(22) Filed: Sep. 22, 2011

(65) Prior Publication Data
US 2013/0074473 A1 Mar. 28, 2013

(51) Int. Cl.
*H03K 7/08* (2006.01)
*H03K 5/04* (2006.01)
*F01N 3/04* (2006.01)

(52) U.S. Cl.
CPC .. *H03K 7/08* (2013.01); *H03K 5/04* (2013.01); *F01N 3/04* (2013.01)
USPC ........... 332/109; 327/174; 327/172; 123/672; 60/282

(58) Field of Classification Search
USPC .................. 331/109; 327/172, 174, 175, 176; 239/8, 11, 99, 569; 122/5.51, 5.52; 123/672, 674, 478, 485, 472, 475, 123/568.21; 60/272, 282, 284, 299
See application file for complete search history.

(56) References Cited

U.S. PATENT DOCUMENTS

| 3,822,678 A | 7/1974 | Bassot et al. |
| 3,987,764 A | 10/1976 | Scofield |
| 4,620,312 A * | 10/1986 | Yamashita ..................... 375/238 |
| 4,638,255 A * | 1/1987 | Penney .......................... 327/175 |
| 6,504,409 B1 * | 1/2003 | Laletin ........................... 327/175 |
| 2010/0271096 A1* | 10/2010 | Kurokawa ...................... 327/170 |
| 2011/0175555 A1* | 7/2011 | Daemmrich et al. ......... 318/135 |

FOREIGN PATENT DOCUMENTS

WO WO 2009001653 A1 * 12/2008

OTHER PUBLICATIONS

International Search Report and the Written Opinion of the International Searching Authority, PCT/US2012/055996.

* cited by examiner

*Primary Examiner* — Ryan Johnson

(57) ABSTRACT

A method adjusts a pulse width of a signal. The method provides a fixed voltage input trigger pulse (34), of a certain pulse width, to a pulse width generator circuit (10) and provides an output pulse (52) from the pulse width generator circuit such that a pulse width of the output pulse is longer than the certain pulse width, without changing a voltage or frequency of the input trigger pulse. The method is used to drive an injector of a diesel reductant delivery system to inject fluid into an exhaust flow path.

17 Claims, 3 Drawing Sheets

| TABLE 1: TRUTH TABLE FOR D FLIP-FLOP 16 | | | | | |
|---|---|---|---|---|---|
| CLOCK | D1 | R1 | S1 | Q1 | |
| RISING EDGE | 0 | 0 | 0 | 0 | 1 |
| RISING EDGE | 1 | 0 | 0 | 1 | 0 |
| FALLING EDGE | X | 0 | 0 | Q | |
| X | X | 1 | 0 | 0 | 1 |
| X | X | 0 | 1 | 1 | 0 |
| X | X | 1 | 1 | 1 | 1 |

TRIGGER ACTIVATED ADJUSTABLE PULSE WIDTH GENERATOR CIRCUIT FOR AUTOMOTIVE EXHAUST AFTER-TREATMENT AND INJECTION

FIELD

The invention relates to fuel systems of internal combustion engines for vehicles and, more particularly, to a trigger actuated, adjustable pulse width generator (PWG) circuit for controlling an injector for exhaust after-treatment.

BACKGROUND

Existing control systems do not allow an operator to easily adjust the pulse width of the trigger pulse delivered to an injector driver for automotive exhaust after-treatment. Consequently, this deficiency does not allow for the change of the flow rate without varying the voltage or frequency of the trigger pulse. Changing the voltage or frequency is sometimes undesirable or not available.

Thus, there is a need to provide an adjustable pulse width generator circuit that allows an operator to increase the pulse width of an output pulse for driving an injector.

SUMMARY

An object of the invention is to fulfill the need referred to above. In accordance with the principles of the present invention, this objective is obtained by a method of adjusting a pulse width of a signal. The method provides a fixed voltage input trigger pulse, of a certain pulse width, to a pulse width generator circuit. An output pulse is provided from the pulse width generator circuit such that a pulse width of the output pulse is longer than the certain pulse width, without changing a voltage or frequency of the input trigger pulse.

In accordance with another aspect of an embodiment, a pulse width generator circuit adjusts duration of an output pulse. The pulse width generator circuit includes first and second comparator circuits, first and second D flip-flops, and a current mirror. The first comparator circuit is constructed and arranged to receive a fixed voltage input trigger pulse, of a certain pulse width, with output of the first comparator circuit being connected to an input of the first flip-flop. An output of the first flip-flop is connected to a clock of the second flip-flop such that when the second flip-flop receives a rising edge from the first flip-flop, an output of the second flip-flop is pushed high and remains high until being reset by a signal from the second comparator circuit. The second comparator circuit receives a variable inverting input and an output of the second comparator circuit is connected with a capacitor and with the second flip-flop so that as soon as the capacitor charges, a reset of the second flip-flop is activated and the output of the second flip-flop goes to zero. The current mirror is connected to the output of the second flip-flop to provide a constant charging current for the capacitor, with the output of the second flip-flop being the source of the output pulse and a voltage input of the current mirror, as well as a reset input to the second comparator circuit for resetting the second flip-flop to zero. The output of the second flip-flop defines the output pulse having a pulse width longer than the certain pulse width, without changing a voltage or frequency of the input trigger pulse.

Other objects, features and characteristics of the present invention, as well as the methods of operation and the functions of the related elements of the structure, the combination of parts and economics of manufacture will become more apparent upon consideration of the following detailed description and appended claims with reference to the accompanying drawings, all of which form a part of this specification.

BRIEF DESCRIPTION OF THE DRAWINGS

The invention will be better understood from the following detailed description of the preferred embodiments thereof, taken in conjunction with the accompanying drawings, wherein like reference numerals refer to like parts, in which.

DETAILED DESCRIPTION OF THE EXEMPLARY EMBODIMENTS

Figure 1:
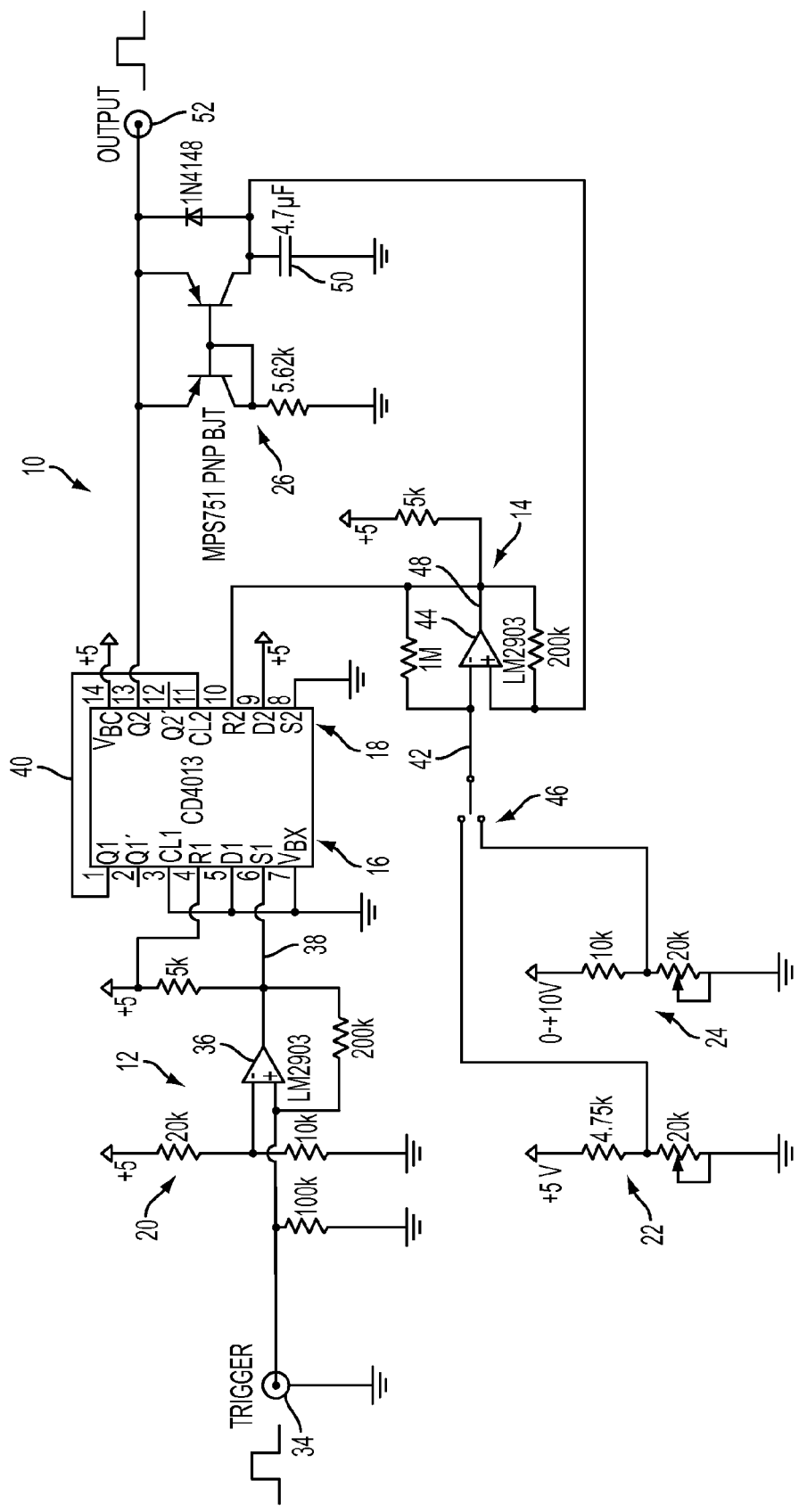
FIG. 1 is a schematic for an adjustable pulse width generator circuit according to an embodiment.

With reference to FIG. 1, an adjustable PWG circuit is shown, generally indicated at 10. The circuit 10 comprises first and second operational amplifier comparator circuits, generally indicated at 12 and 14 respectively, first and second D flip-flops, generally indicated at 16 and 18, respectively, first, second and third voltage dividers, generally indicated at 20, 22 and 24, respectively and a PNP current mirror, generally indicated at 26.

Figures 2, 3:
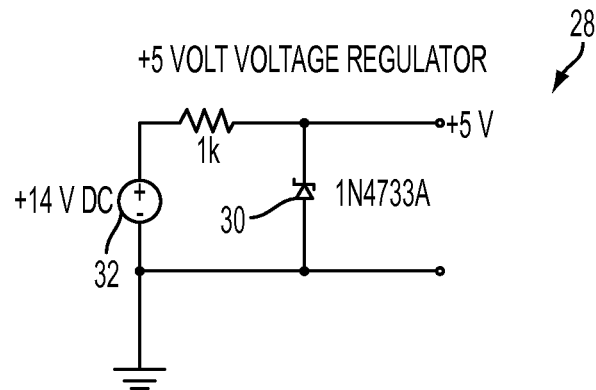
FIG. 2 is a circuit schematic, operating on a 14 volt battery supply, providing a 5 volt power supply to the circuit of FIG. 1.
FIG. 3 is a truth table for a first D flip-flop of the circuit of FIG. 1.

The power for the circuit 10, as well as the active components, is supplied by the power supply circuit, generally indicated at 28, in FIG. 2. The power supply circuit 28 utilizes a zener diode 30 to supply a consistent five volts given a fourteen volt DC input 32.

Returning to FIG. 1, the fixed five volt input trigger pulse 34 (FIG. 1) is applied to the non-inverting input of the operational amplifier 36 of the first comparator circuit 12. The inverting input is supplied 1.67 volts from the voltage divider circuit 20. Before the pulse is applied, the output 38 of the comparator circuit 12 is low, but it is forced high once the pulse is applied. The output 38 of the comparator circuit 12 is connected to the Set (S1) input of the first flip-flop 16. Both the Clock (CL1) and the Delay (D1) of the flip-flop 16 are connected to ground (which is equivalent to the 0 bit in the truth table of FIG. 3, which will be explained more fully below). The Reset (R1) input is connected to positive five volts (which is equivalent to the 1 bit in the truth table of FIG. 3) and the previous state is unused. As soon as the Set (S1) input is pushed high by the comparator output 38, the Output (Q1) is also pushed high as indicated in the truth table of FIG. 3. The Q1 output 40 of the first flip-flop 16 is connected to the Clock (CL2) of the second flip-flop 18. This provides a rising edge that will activate the second flip-flop 18. In the second flip-flop 18, the Set (S2) input is wired to ground, the Delay (D2) input is connected to a positive five volts, and the previous state is again unused. As soon as the second flip-flop 18 receives the rising edge from the first flip-flop 16, the Output (Q2) of the second flip-flop 18 is pushed high, as indicated in the truth table of FIG. 3. The output (Q2) will remain high until the reset pin (R2) receives and input from the second comparator circuit 14.

The variable inverting input 42 of the operational amplifier 44 of second comparator circuit 14 is governed by a switch, generally indicated at 46, which allows an operator to choose whether to control the inverting input 42 by a trim-pot or a separate voltage input that can vary from zero to ten volts, depending on the desired output. Both options vary the voltage on the inverting input 42 through the use of a simple voltage divider 22 or 24. The output 48 of the second comparator circuit 14 supplies a capacitor 50 as well as the Reset (R2) of the second flip-flop 18. As soon as the capacitor 50 charges up, the reset pin (R2) of the second flip-flop 18 is activated and the output of the second flip-flop 18 goes to zero. Therefore the output 52 of the PWG circuit 10 also goes to zero.

A current supply, in the form of the PNP current mirror 26, is connected to the output (Q2) of the second flip-flop 18. This provides a constant charging current for the capacitor 50 such that a reference voltage, as a function of time, has a linear relationship (dV/dt) to the comparator 44. Therefore the output (Q2) of the second flip-flop 18 provides the combined function of being the source of the output pulse 52, as well as the voltage input of the current mirror 26, and the reset input of the comparator voltage reference ramp to zero.

Figure 4:
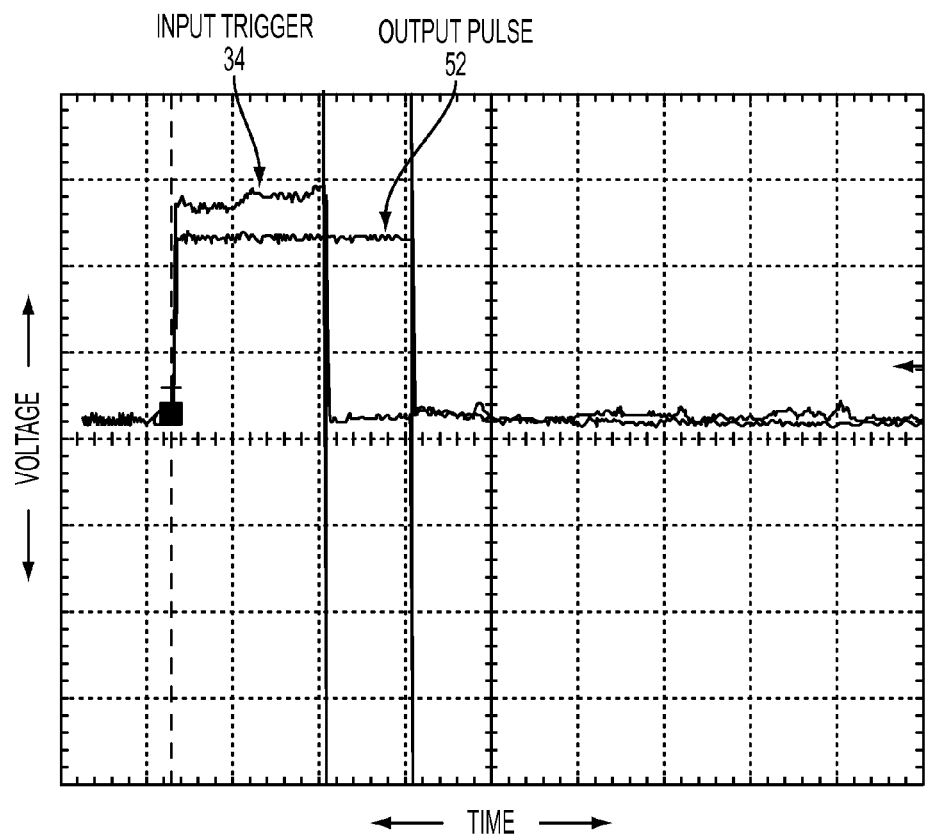
FIG. 4 is shows the input trigger voltage pulse duration and output voltage pulse duration of the circuit of FIG. 1.

An example of the output pulse 52 can be seen in FIG. 4 where the input pulse 34 is 3.68 milliseconds and the output pulse 52 of the adjustable PWG circuit 10 increases the pulse to 5.60 milliseconds.

In conventional injector drivers, the pulse width is generally fixed at a time around 3 milliseconds. The adjustable PWG circuit 10 allows the operator to increase the output pulse 52 from about 0.25 to 30 milliseconds as compared to the input pulse 34, simply by turning a knob (FIG. 4) of a trim-pot 53 or by applying an input voltage, separate from the supply voltage, between 0 and 10 volts. The advantage of having an adjustable output pulse width is to be able to easily control the flow rate of an injector 54 (FIG. 4) at a given frequency and voltage. The PWG circuit 10 also eliminates the need for an op-amp integrator for the ramp generator of a reference voltage, and the additional reset of the integrator capacitor, as this is inherent in the use of the current mirror (when Q2 goes low).

Figure 5:
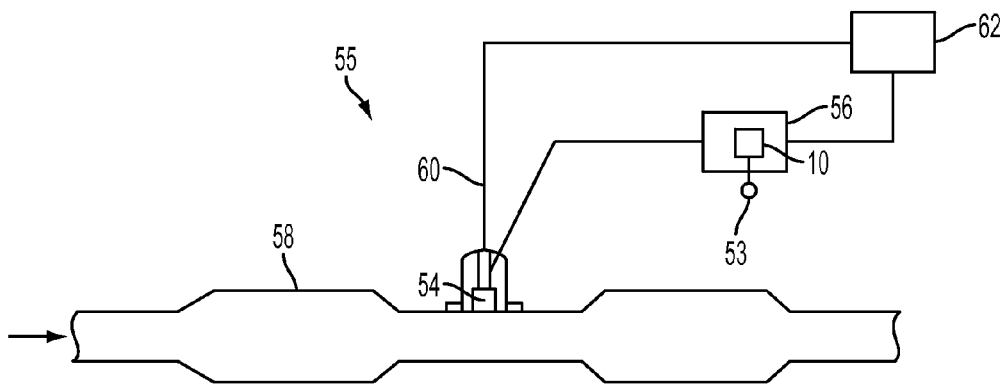
FIG. 5 is a schematic view of a reductant delivery system for injecting urea into an exhaust flow path, using the circuit of FIG. 1 to drive an injector.

The adjustable PWG circuit 10 is configured for a diesel reductant delivery system, generally indicated at 55, for exhaust after-treatment. Thus, with reference to FIG. 5, the PWG circuit 10 is part of a driver 56 for controlling operation of the injector 54 that is coupled to an exhaust flow path 58 of a diesel fueled vehicle. An inlet 60 of the injector 56 receives urea from a supply 60. The PWG circuit 10 allows an operator, in a lab setting, to vary the output pulse 52 duration to the driver 54 of the injector 56 at a given frequency and voltage. This allows the operator to better control the flow rate of the injector 56 without changing the frequency or voltage of the input pulse 34. The urea fluid is injected into the exhaust flow path 58 to treat NOx in the known manner.

The PWG circuit 10 can be a module solution for exhaust after-treatment where an analogue voltage could be used to control the output of the reductant delivery system driver 54 completely. The adjustable PWM circuit 10 is flexible in application and can be used in any situation where a normally unchangeable trigger or pulse is needed to vary in duration without having to change other parameters such as the voltage.

The foregoing preferred embodiments have been shown and described for the purposes of illustrating the structural and functional principles of the present invention, as well as illustrating the methods of employing the preferred embodiments and are subject to change without departing from such principles. Therefore, this invention includes all modifications encompassed within the spirit of the following claims.

What is claimed is:

1. A method of adjusting a pulse width of a signal, the method comprising:
   providing a fixed voltage input trigger pulse, of a certain pulse width, to a pulse width generator circuit, the pulse width generator circuit including first and second comparator circuits, first and second D flip-flops, and a current mirror, and
   providing an output pulse from the pulse width generator circuit such that a pulse width of the output pulse is longer than the certain pulse width, without changing a voltage or frequency of the input trigger pulse,
   wherein the step of providing the output pulse includes:
   receiving the input trigger pulse at the first comparator circuit, with output of the first comparator circuit being provided to an input of the first flip-flop, and output of the first flip-flop being connected to a clock of the second flip-flop such that when the second flip-flop receives a rising edge from the first flip-flop, an output of the second flip-flop is pushed high and remains high until being reset by a signal from the second comparator circuit, wherein the output of the second flip-flop defines the output pulse.

2. The method of claim 1, wherein the output pulse width is adjustably set by a trim pot.

3. The method of claim 2, wherein the trim pot is provided by a voltage divider circuit.

4. The method of claim 1, wherein the output pulse width is adjustably set by a separate voltage input that can vary from zero to ten volts.

5. The method of claim 4, wherein the separate voltage input is provided by a voltage divider circuit.

6. The method of claim 1, wherein output pulse width is 0.25 to 30 milliseconds greater than the certain pulse width.

7. The method of claim 1, further comprising using the output pulse to drive an injector of a diesel reductant delivery system to inject fluid into an exhaust flow path.

8. The method of claim 1, wherein the fixed voltage input trigger pulse is provided at five volts.

9. The method of claim 1, wherein the method includes governing, via a switch, a variable inverting input to the second comparator circuit to permit a choice of controlling the variable inverting input by a trim-pot or by a separate voltage input that varies from zero to ten volts, wherein an output of the second comparator circuit is connected with a capacitor and with the second flip-flop so that as soon as the capacitor charges to a reset voltage, a reset of the second flip-flop is activated and the output of the second flip-flop goes to zero.

10. The method of claim 9, wherein the current mirror is connected to the output of the second flip-flop to provide a constant charging current for the capacitor, with the output of the second flip-flop being the source of the output pulse and a voltage input of the current mirror, as well as a reset input to the second comparator circuit for resetting the second flip-flop to zero.

11. A pulse width generator circuit for adjusting duration of an output pulse, the pulse width generator circuit comprising:
   first and second comparator circuits,
   first and second D flip-flops, and
   a current mirror,
   wherein the first comparator circuit is constructed and arranged to receive a fixed voltage input trigger pulse, of a certain pulse width, with output of the first comparator circuit being connected to an input of the first flip-flop, and output of the first flip-flop being connected to a clock of the second flip-flop such that when the second flip-flop receives a rising edge from the first flip-flop, an output of the second flip-flop is pushed high and remains high until being reset by a signal from the second comparator circuit, wherein the second comparator circuit receives a variable inverting input and an output of the second comparator circuit is connected with a capacitor and with the second flip-flop so that as soon as the capacitor charges to a reset voltage, a reset of the second flip-flop is activated and the output of the second flip-flop goes to zero, wherein the current mirror is connected to the output of the second flip-flop to provide a constant charging current for the capacitor, with the output of the second flip-flop being the source of the output pulse and a voltage input of the current mirror, as well as a reset input to the second comparator circuit for resetting the second flip-flop to zero, and wherein the output of the second flip-flop defines the output pulse having a pulse width longer than the certain pulse width, without changing a voltage or frequency of the input trigger pulse.

12. The circuit of claim 11, further comprising a switch for governing the variable inverting input to the second comparator circuit, the switch being constructed and arranged to permit a choice of controlling the variable inverting input by a trim-pot or by a separate voltage input that varies from zero to ten volts.

13. The circuit of claim 11, wherein the variable inverting input is provided by a voltage divider circuit.

14. The circuit of claim 11, wherein the output pulse width is 0.25 to 30 milliseconds greater than the certain pulse width.

15. The circuit of claim 11, wherein the pulse width generator circuit is part of a driver for driving an injector of a diesel reductant delivery system for injecting fluid into an exhaust flow path.

16. The circuit of claim 15, in combination with the injector.

17. The circuit of claim 11, wherein the fixed voltage input trigger pulse is five volts.

* * * * *